(12) United States Patent
Markert et al.

(10) Patent No.: US 9,952,567 B2
(45) Date of Patent: Apr. 24, 2018

(54) METHOD FOR SETTING UP A FUNCTIONALITY FOR A CONTROL UNIT

(75) Inventors: Heiner Markert, Stuttgart (DE); Thomas Kruse, Stuttgart (DE); Volker Imhof, Kornwestheim (DE); Thorsten Huber, Gerlingen (DE); Rene Diener, Ludwigsburg (DE); Ernst Kloppenburg, Ditzingen (DE); Felix Streichert, Yokohama (JP); Holger Ulmer, Ulm (DE); Stefan Angermaier, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1097 days.

(21) Appl. No.: 14/240,312

(22) PCT Filed: Jul. 19, 2012

(86) PCT No.: PCT/EP2012/064147
§ 371 (c)(1),
(2), (4) Date: Jun. 24, 2014

(87) PCT Pub. No.: WO2013/026635
PCT Pub. Date: Feb. 28, 2013

(65) Prior Publication Data
US 2014/0330400 A1 Nov. 6, 2014

(30) Foreign Application Priority Data
Aug. 22, 2011 (DE) .................. 10 2011 081 346

(51) Int. Cl.
*G06F 7/60* (2006.01)
*G06F 17/10* (2006.01)
(Continued)

(52) U.S. Cl.
CPC ......... *G05B 13/04* (2013.01); *G06F 17/5009* (2013.01); *G06F 17/5045* (2013.01); *G06N 7/005* (2013.01)

(58) Field of Classification Search
CPC .... G05B 13/04; G06N 7/005; G06F 17/5009; G06F 17/5045
(Continued)

(56) References Cited

U.S. PATENT DOCUMENTS 6,208,953 B1 * 3/2001 Milek ................ G05B 23/0254
702/34
2005/0071037 A1 * 3/2005 Strang .............. G05B 19/41885
700/121
(Continued)

FOREIGN PATENT DOCUMENTS

CN 101424219 A 5/2009
DE 102008001081 A1 10/2009
(Continued)

OTHER PUBLICATIONS

International Search Report for PCT/EP2012/064147, dated Oct. 25, 2012.
(Continued)

*Primary Examiner* — Dwin M Craig
(74) *Attorney, Agent, or Firm* — Norton Rose Fulbright US LLP; Gerard Messina

(57) ABSTRACT

A method is provided for populating a function for a control unit with data, in which method measurements are performed on a system at different measuring points on a test stand, and a global data-based model is set up based on the obtained measured values, and virtual measurements which simulate real measurements on the test stand are carried out on the global data-based model, and uncertainties for virtual measured values of the virtual measurements are determined
(Continued)

from the global data-based model, the uncertainties of the virtual measured values being taken into account when populating the function for the control unit with data.

7 Claims, 2 Drawing Sheets

(51) Int. Cl.
*G06F 17/50* (2006.01)
*G05B 13/04* (2006.01)
*G06N 7/00* (2006.01)

(58) Field of Classification Search
USPC .................................................. 703/2, 13
See application file for complete search history.

(56) References Cited

U.S. PATENT DOCUMENTS

| | | | |
|---|---|---|---|
| 2005/0268617 A1* | 12/2005 | Amond, III | F02C 9/34 60/776 |
| 2006/0064291 A1* | 3/2006 | Pattipatti | G05B 23/0243 703/14 |
| 2007/0265805 A1* | 11/2007 | Lee | G01M 15/05 702/187 |
| 2008/0257315 A1* | 10/2008 | Thomas | F02M 31/18 123/548 |

FOREIGN PATENT DOCUMENTS

| | | |
|---|---|---|
| JP | 2003-328030 | 11/2003 |
| JP | 2006244042 A | 9/2006 |
| JP | 2008-71111 | 3/2008 |
| JP | 2010-97501 | 4/2010 |
| KR | 20090001148 | 1/2009 |
| WO | WO2006/051039 | 5/2006 |
| WO | 2013026635 A1 | 2/2013 |

OTHER PUBLICATIONS

Kriging, ("A Statistical Approach to Some Mine Valuations and Allied Problems at the Witwatersrand", D.G. vol. 52, No. 6, pp. 119-139, 1951.

Matheron, "The Intrinsic Random Functions, and Their Applications", Adv. Appl. Prob., 5, pp. 439-468, 1973.

Rasmussen et al., "Gaussian Processes for Machine Learning", MIT Press, 2006.

Snelson et al., "Sparse Gaussian Processes Using Pseudo-Inputs", Advances in Neural Information Processing Systems 18, pp. 1259-1266, 2006.

Lowe et al., "Validation of Neural Networks in Automotive Engine Calibration", Artificial Neural Networks, Conference Publication No. 440, pp. 221-226, 1997.

Dissertation of Jan Poland, "Modellgestuetzte und Evolutionaere Optimierungsverfahren fuer die motorentwicklung," ISBN 383250015, 2002 (including English summary of Introduction), pp. 1-146.

C.E. Rasmussen et al., "Gaussian Processes for Machine Learning," the MIT Press, ISBN 026218253x, 2006, pp. 1-248.

Mitterer et al.: "Model-based characteristics map optimization—A new approach for increasing efficiency in control unit application", ATZ Automobiltechnische Zeitschrift 102(3), (2000), pp. 188-194.

Toepfer et al.: "Stationary engine measurement using neural networks", in Modellgestuetzte Steuerung, Regelung und Diagnose von Verbrennungsmotoren, Springer Verlag, Berlin (2003), pp. 130-152.

* cited by examiner

METHOD FOR SETTING UP A FUNCTIONALITY FOR A CONTROL UNIT

FIELD OF THE INVENTION

The present invention relates to a method for setting up a functionality for a control unit, especially for an engine control unit in a motor vehicle, and to a system for executing the method.

BACKGROUND INFORMATION

Control units are electronic modules, which are used in motor vehicles for control and/or regulation processes. Toward this end, functionalities, normally realized in the form of software and executed on a processor or CPU in the control unit, are implemented in the control unit.

The application of control units means populating the control units with data. In this context the populating with data denotes the inputting or copying of data into or onto a data-storing entity, in most cases a storage device in the control unit.

One working step in the application in engine control units is what is known as the basic adaptation. During the basic adaption, for example, data for engine control functions for detecting the cylinder charge are input. Tools for optimizing all identifiers or labels of such a function are used for this purpose.

A great number of measurements, which are usually determined on an engine test bench, are required for the input into these tools, for which in addition to basic influencing parameters of engine speed and load, further influencing quantities in accordance with the provided charge actuators, such as camshaft angle positions (intake and discharge camshaft), exhaust-gas recirculation rates, intake manifold switchovers, charge motion valve positions, etc., are varied. From the related art, "Design of Experiments" (DoE) methods are known, which instead of employing a grid measurement of all influencing parameters to be varied, use a certain selection of necessary measurements per operating point, defined by engine speed and load, in order to adapt a local operating point model such as a polynomial model (cornerstone) on that basis. These models are then able to be queried only at the operating points, but not in-between.

Populating the labels of a function such as the charge detection, for example, with data requires measurements across the entire operating range, which have to be carried out with the necessary precision. To keep the number of measurements low nevertheless, a so-called global data-based model is inserted between measurements on the test stand and the optimization tool. Virtual measurements using all kinds of variations of the influencing parameters are then carried out on this model.

A method for developing a global model of an output parameter for a dynamic system is known from the International Published Patent Appln. WO 2006/051039. This could be an operating parameter of an internal combustion engine, for instance. This method is to make it possible to manage with only a small number of measuring points for calculating the output parameter for all states. In the development of the global model, a development of the input variable with polynomials takes place and a calculation of coefficients of the development. In the printed publication it is furthermore described to determine variances at measuring points by way of repeat measurements. Parallel to the model of the data, these variances are used for setting up a second model of the variances. This makes it possible to describe in which areas the measurements are more precise and in which areas the measurements are less precise.

SUMMARY

Against this background, a method for populating a function for a control unit with data and a system for implementing the method are provided.

Setting up the global data-based model offers the advantage of being able to use considerably fewer measurements than required in a grid measurement to represent the behavior of the engine with the required accuracy across all influencing parameters. In addition, fewer measurements than for multiple local operating point models are necessary because the global model is able to "learn" also from the measurements of adjacent operating points. Because the number of measuring points is reduced, future application tasks featuring an increasing number of influencing variables, in particular, become realizable and manageable only by the reduced measuring time.

The global data-based model supplies a value for the target variables for any desired engine speed and load position, not only at the operating points measured. The model quality of the global data-based model is able to be checked and evaluated on the basis of the model uncertainty, prior to proceeding with the next step of the optimization. In so doing, it is determined whether the number of measurements and the variation of the actuator positions were sufficient. It is also easily possible to identify outliers in the measurement.

In addition to a prediction of the target variables, such as charge, consumption or emissions, the global data-based model also needs to have the ability to calculate a model uncertainty (sigma) for each adjusted variation of influencing parameters. One example of data-based models that indicate the model uncertainty is the so-called Bayesian regression method such as Kriging ("A statistical approach to some mine valuations and allied problems at the Witwatersrand", D. G. Krige, 1951; "The intrinsic random functions, and their applications", G. Matheron, Adv. Appl. Prob., 5, pp 439-468, 1973), Gaussian process models ("Gaussian Processes for Machine Learning", Rasmussen and Williams, MIT Press, 2006), sparse Gaussian processes ("Sparse Gaussian processes using pseudo-inputs"; E. Snelson and Z Ghahramani, Advances in Neural Information Processing Systems 18, pp 1259-1266, 2006) and many others. Another option for data-based models having model uncertainty are committees of neural networks ("Validation of Neural Networks in Automotive Engine Calibration", D. Lowe and K. Zapart, 1997).

The global data-based model furthermore handles the measuring noise of the test stand measurement, i.e., in practice, no interpolation through each measuring value, but a smooth regression, for example, is implemented between the measuring points.

It should furthermore be noted that with the aid of the data-based model, the behavior of the measured system is able to be visualized by varying the input parameters, which leads to greater system understanding and thus to better quality of the data population.

If the global data-based model offers the required quality, this model may be used to implement virtual measurements at the locations required for the optimization. The number of such measurements may by far exceed the number of measurements required to form the model, since an engine test stand is no longer required for this purpose.

Based on the indicated model uncertainty sigma, a decision is able to be made at each virtual measuring point as to whether or not it is to be used for the subsequent optimization. In this way it is avoided that the optimizer unnecessarily attempts to adapt invalid measured values, which is comparable to unidentified measuring outliers.

The virtual measurements furthermore have the advantage that they no longer have any measuring noise and therefore are much more suitable for the subsequent optimization task. When the regression surfaces are smooth, the optimization methods do not get stuck at so-called local minima, as this is more likely to occur with interpolated surfaces.

If there is a change in the node positions and node numbers of the labels in the control unit function to be populated by data, it will be necessary to carry out measurements at additional measuring points. For example, if a characteristics map having 3×3 nodes is expanded to 5×5 nodes, it may indeed be possible to calculate the 25 characteristics map values of the larger characteristics map from the smaller characteristics map by way of linear interpolation. However, additional information of the target variables of the engine is required in order to utilize the variability of this characteristics map. One advantage of the introduced method is that the additional measuring points need not be painstakingly measured on the test stand but may be measured in virtual manner directly on the global data-based model.

If a certain engine is installed in different vehicle variants, the control unit functions are optimized for each vehicle variant in different operating ranges. This requires individual other measuring points for the optimization of the control unit function. In the described method, the engine may be measured once in comprehensive manner, in order to set up the global data-based model. The sets of virtual measuring points for the different operating ranges of the various vehicle variants are then able to be measured on a global data-based model.

Within the framework of the introduced method, for one, the quality of the global data-based model may be checked based on checkpoints, or it is possible to use the uncertainties or variances of the virtual measuring results to determine that the quality of the model is insufficient, either over all or in certain ranges. Improvements of the data-based model are able to be made on the basis of supplementary measured values from additional measurements on the test stand, if the quality of the global data-based model is insufficient in at least the one range of the measuring points. For another, the uncertainty of the individual virtual measuring points may be taken into account during the data population and thus the setup of the control unit function. In this context it may be the case that an uncertainty is determined for each measured value. Using the uncertainty of the virtual measured value, for which at least one of the measured values may be utilized, a decision can be made as to whether it will be used for populating the function with data.

Additional advantages and developments of the present invention result from the specification and the appended figures.

It is understood that the features mentioned above and still to be explained below may be used not only in the indicated combination, but in other combinations as well, or by themselves, without departing from the scope of the present invention.

DETAILED DESCRIPTION

Figure 1:
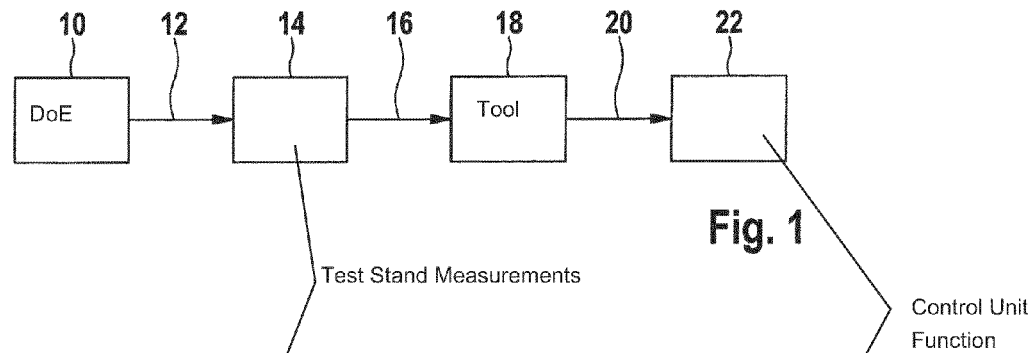
FIG. 1 shows a method from the related art.

The present invention is represented schematically in the drawing with the aid of specific embodiments; it is described in detail below with reference to the drawing.

FIG. 1 shows the current procedure when populating a control unit function with data, in the form of a diagram. Experiment planning using a method of the DoE 10 takes place. In the process, a raster measurement of all influence variables to be varied is carried out in order to obtain input variables (arrow 12) for test stand measurements 14. Test stand measurements 14 result in measured values that include measuring noise, which are input into a tool 18 (arrow 16) in which an optimization of the labels of the function is implemented. The use of the optimized label of the function (arrow 20) then results in populated control unit function 22.

According to the related art, a suitable experiment plan for the measurements thus is set up for the control unit function to be populated. These measurements are adjusted as precisely as possible on the engine test stand, and the target variables such as charge, consumption and emissions are measured. These measured values are used to optimize the label values of a function. The result is a data-populated function that is able to be utilized in an engine control unit.

Figure 2:
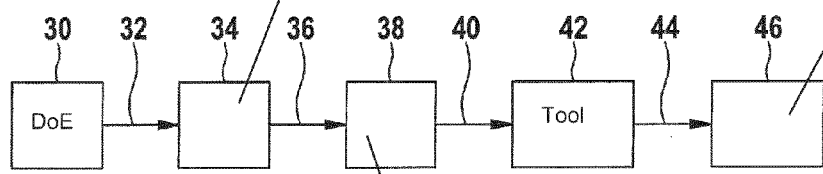
FIG. 2 shows a method according to the present invention.

FIG. 2 shows the use of a global data-based model for populating a function for a control unit with data, in which a global data-based model is inserted between a test stand measurement and an optimization. In the process, experiment planning using a method of the DoE 30 takes place. Input variables (arrow 32) for test stand measurements 34 are ascertained by varying influencing parameters. During the test stand measurements 34, measured values that include measuring noise are obtained, which are used (arrow 36) to set up or train a global data-based model 38.

Virtual measurements, which simulate real measurements on the test stand, are carried out on or at this global data-based model 38. This results in measured values without noise (arrow 40), which are input into a tool 42 in which an optimization of the labels of a function is carried out. The populated control unit function 46 then results from the optimized label of the function (arrow 44).

In the method introduced here in FIG. 2, the global data-based model 38 is inserted following test stand measurement 34. Training with the aid of training points takes place based on the measurements from the test stand, and the quality is verified based on check points. ASC models in a modeling tool may be used as model type for this purpose. Other model types such as neural networks or support vector regression are conceivable alternatives, but they require an adequate calculation of the model uncertainty sigma in addition. Even outliers from the test stand are able to be identified by such models and either ignored or remeasured. The model building step is concluded when the global data-based model has the quality required for the application.

Based on the global data-based model, virtual measurements which are better suited for the label optimization are simulated. This may also be realized in a tool in which a data-based model is queried at predefined measuring points. Now, these virtual measurement are no longer subject to measuring noise because repeated querying at the same location also results in the same measured value. Based on the model uncertainty, the particular measuring points having a large sigma are able to be culled from the requested virtual measuring points.

Figure 3:
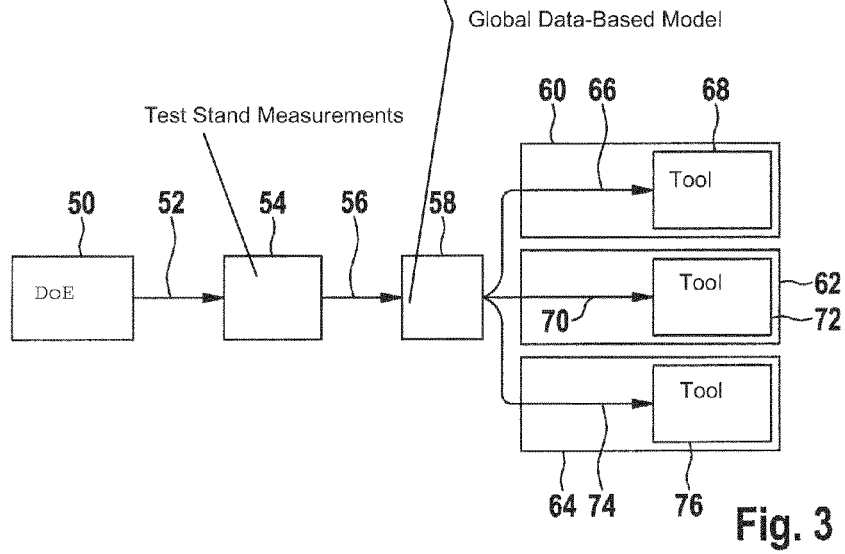
FIG. 3 shows the use of a global data-based model.

FIG. 3 shows the use of a model for data-populating different vehicle variants. Experiment planning using a method of the DoE 50 takes place. Input variables (arrow 52) for test stand measurements 54 are ascertained by variation of influencing variables. The test stand measurements result in measured values that include measuring noise, by which (arrow 56) a global data-based model 58 is established. This global data-based model 58 is used for a first vehicle variant 60, a second vehicle variant 62, and a third vehicle variant 64. For the first vehicle variant 60, virtual measured values in a first operating range (arrow 66) are obtained, which are input into a tool 68 for optimizing the labels of the function. For the second vehicle variant 62, virtual measured values of a second operating range (arrow 70) are obtained accordingly, which are input into a tool 72 for optimizing the labels of the function. Finally, for the third vehicle variant 64, virtual measured values of a third operating range (arrow 74) come about, which are input into a corresponding tool 76 for optimizing the labels of the function.

FIG. 3 therefore illustrates the use of a shared global data-based model 58 for populating control unit functions with data for different vehicle variants. It turns out that the measuring requirement on the test stand to cover the operating ranges of all vehicle variants increases only to a negligible extent.

Figure 4:
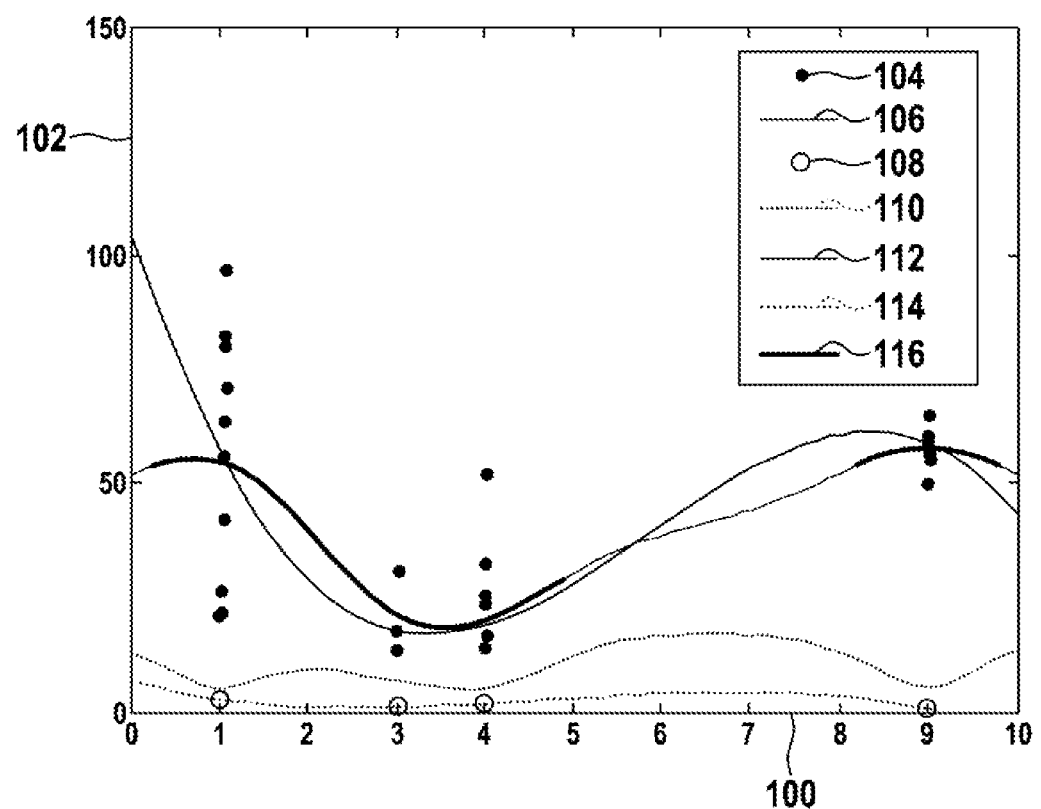
FIG. 4 shows a graph with measured values that have been plotted at different measuring points.

FIG. 4 illustrates the employed modeling method in the form of a graph, in which measuring locations or measuring points X are plotted on an abscissa 100, and the level of the measured values is plotted on an ordinate 102. Plotted on the graph are measured values or data 104, a polynomial 106 of the data, a sigma 108 of the data, a polynomial 110 of the sigma of the data, the Bayesian regression model 112 of the data, a sigma 114 of the Bayesian regression model, and a validity 116 of the Bayesian regression model.

Ten measurements (at x=3, only 5 measurements) have been performed (data) at the four measuring points in FIG. 4. A simple polynomial model of the third order, whose coefficients were determined (polynomial of the data), was selected as model of the output variable. The variance of the measurement at the four measuring points was ascertained by repeat measurements (sigma of the data), and from these four values, a polynomial model of the third order (polynomial of sigma of the data) was then set up. It is obvious that the variance of the measured data on the left side is greater than in the center. On the right side the repeat measurement is quite precise.

The described method uses a variant of the Bayesian regression model, e.g., the Gaussian process models of data. It is obvious that both models calculate comparable model values at the measuring points. In addition to the model prediction of the Bayesian regression model, a model uncertainty is indicated as well (sigma of the Bayesian regression model). It indicates the certainty of the model in its prediction at a particular input position. As can be seen, the model sigma at the four measuring points is small because information is available to the model at these points. While it is true that the model provides a model prediction between the measuring points (e.g., from 5 through 8), the model is uncertain due to the greater model sigma.

This model uncertainty thus is dependent on the position of the measuring points and not on the variance of the measured data at the measuring points. The model sigma at x=1 has the same magnitude as at x=9, despite the fact that the variance of the repeat measurements differs considerably. Nevertheless, the model is able to make a very precise statement regarding the average value of the measurement. At x=3, fewer repeat measurements were taken. For that reason, the model sigma is slightly higher than at x=4. Based on this model sigma, it is possible to check whether the model quality is sufficient in the entire measured range (validity of the Bayesian regression model).

The polynomial model of the variance of the measured values as known from the related art therefore differs fundamentally from the evaluation of the model quality by means of the model sigma of the Bayesian regression model.

It should be noted that in the introduced method, the use of the model sigma for evaluating the model quality is implemented for the first time.

The virtual measurements simply constitute querying of the data-based model at the desired input position (e.g., for x=6). If required by the optimization task, the model may be queried at the points x=[0 2 4 6 8 10], for example, despite the fact that the measurements for setting up the model have taken place only at x'=[1 3 4 9]. Querying of a data-based model takes place in the form of virtual measurements; especially the assessment that the model prediction for x=[6 8] is too imprecise has not yet been described.

In some cases, the nodes of individual characteristics lines or characteristics maps in control unit functions are modified, for example when the node raster is too coarse, as a result of linking to other characteristics lines or characteristics maps through group nodes, etc. If the output variable for x=[1 3 5 6 7 9] is then required, this may once again be implemented on the model, independently of the measuring points for setting up the model. These characteristics lines or characteristics maps should not be mistaken for the global data-based model; instead, they represent optimized setpoint values of the input variables.

When setting up, or when training, the data-based model such as a Bayesian regression model, measurements according to an experiment schedule (DoE/Design of Experiment) are essentially required. However, this experiment schedule should have different properties than an experiment schedule for estimating the coefficients of a polynomial. As can be gathered from FIG. 4, the measurements should be distributed in space-filling manner so that the Bayesian regression model is valid everywhere. No repeat measurements at individual measuring points are required for this purpose.

One example of a simple global model via the operating points of engine speed, the further input variable of injection quantity and the output variable of consumption is meant to illustrate the situation of reducing the required measurements.

If a characteristics map that has a raster of [6×5] nodes is chosen as global model, then at least 30 measurements are required in variations of the engine speed and injection quantity in order to obtain the characteristics map values for the consumption.

The first reduction in measurements was realized by assuming quadratic behavior along the injection quantity input variable. Therefore, a polynomial model was set up for each operating point (6 nodes), for which at least three measurements per operating point are required. As a minimum, this results in 18 measurements for setting up 6 operating point models (see cornerstone).

No statements concerning the consumption were able to be made in these models if an engine speed was required between the nodes.

Setting up a global Gaussian process model for the consumption via engine speed and injection quantity requires approximately 15 space-filling measurements when the consumption surface is smooth.

In the printed publication International Published Patent Appln. No. WO 2006/051039, 528 precisely positioned measuring points are indicated for calculating the coefficients of a global Chevyshev polynomial of the 2-3-3-10 order. Approximately 300 space-filling measurements would be required to set up a comparable Gaussian process model.

It is clear from FIG. 4 that the measurements at the measuring points are subject to measuring noise due to the measuring principle or the measuring devices. If the real measurements are replaced by virtual measurements on the global data-based model, they display no noise because the function value always returns the same value y at a location x.

The introduced method represents an application method for parameterizing the control unit functions for an optimal operation of, for example, an engine. Then, no further measurements on the real system, in this case, the engine on the test stand, are necessary when the position or the number of nodes of one or multiple label(s) of the control unit functions is varied, and in populating the control unit functions with data for different vehicle variants having the same engine.

What is claimed is:

1. A method for populating a function implemented in a control unit with data, comprising:
    performing a measurement on a test stand on a system at different measuring points to produce obtained measured values;
    setting up a global data-based model on the basis of the obtained measured values;
    performing a virtual measurement that simulates a real measurement on the test stand on the global data-based model,
    ascertaining an uncertainty for a virtual measured value of the virtual measurement is ascertained from the global data-based model;
    taking into account the uncertainty of the virtual measured value when populating the function for the control unit with data;
    detecting on the basis of the uncertainty of the virtual measured value whether a quality of the data-based model is insufficient in at least one range of the measuring points for populating the function with data;
    if the quality of the data-based model is insufficient in at least the one range of the measuring points, obtaining an improvement of the data-based model on the basis of a supplementary measured value from a supplementary measurement on the test stand;
    if the quality of the data-based model offers a required quality for populating the function with data, populating the function implemented in the control unit with data in that a measured values from the virtual measurement is entered into a tool, in which an optimization of a label of the function implemented in the control unit is performed; and
    operating a physical process of an engine by causing the control unit to execute the populated function.

2. The method as recited in claim 1, wherein the uncertainty is determined for each virtual measured value.

3. The method as recited in claim 1, wherein the uncertainty of at least one of the virtual measured values is used to decide whether the at least one of the virtual measured values is to be utilized for populating the function with data.

4. The method as recited in claim 1, wherein the global data-based model includes a Bayesian regression model.

5. The method as recited in claim 1, wherein the global data-based model includes a Gaussian process model.

6. The method as recited in claim 1, further comprising implementing a smooth regression between the measuring points.

7. The method as recited in claim 1, further comprising visualizing a behavior of a measured system on the basis of the global data-based model.

* * * * *